(12) United States Patent
Liu et al.

(10) Patent No.: US 8,316,796 B2
(45) Date of Patent: Nov. 27, 2012

(54) FILM COATING SYSTEM AND ISOLATING DEVICE THEREOF

(75) Inventors: Chi-Hung Liu, Taichung County (TW);
Chih-Ming Chen, Taichung County (TW); Chun-Hsien Su, Hsinchu (TW);
Chih-Wei Chen, Taipei County (TW);
Wen-Tung Hsu, Yunlin County (TW);
Chun-Hung Lin, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 707 days.

(21) Appl. No.: 11/954,843

(22) Filed: Dec. 12, 2007

(65) Prior Publication Data

US 2009/0064933 A1    Mar. 12, 2009

(30) Foreign Application Priority Data

Sep. 10, 2007   (TW) .............................. 96133679 A

(51) Int. Cl.
   *C23C 16/00*   (2006.01)
(52) U.S. Cl. .................................... 118/723 R; 118/722
(58) Field of Classification Search ............... 118/723 R
   See application file for complete search history.

(56) References Cited

U.S. PATENT DOCUMENTS

| | | | |
|---|---|---|---|
| 6,652,069 B2 * | 11/2003 | Toda et al. ...................... | 347/45 |
| 6,849,306 B2 | 2/2005 | Fukuda et al. | |
| 2003/0113479 A1 * | 6/2003 | Fukuda et al. ................ | 427/569 |
| 2006/0157453 A1 * | 7/2006 | Dumont et al. ............ | 219/121.5 |
| 2009/0010818 A1 * | 1/2009 | Song ........................ | 422/186.05 |

FOREIGN PATENT DOCUMENTS

| | | |
|---|---|---|
| CN | 1668448 A | 9/2005 |
| CN | 1672248 A | 9/2005 |
| EP | 0617142 | 9/1994 |
| JP | 11-200052 A | 7/1999 |
| JP | 2000-121804 A | 4/2000 |
| JP | 2002-343725 A | 11/2002 |
| JP | 2003-155571 | 5/2003 |
| JP | 2003-166063 A | 6/2003 |
| JP | 2004-124239 | 4/2004 |
| JP | 2005-531654 A | 10/2005 |
| WO | WO 2006/091448 A2 | 8/2006 |

OTHER PUBLICATIONS

Taiwan Patent Office, Office Action, Patent Application Serial No. 096133679, Jul. 14, 2011, Taiwan.
Japan Patent Office, Office Action, Patent Application Serial No. 2008-208934, Aug. 30, 2011, Japan.
Japan Patent office, Notice of Allowance, Patent Application Serial No. 2008-208934, Mar. 27, 2012, Japan.
China Patent Office, Office Action, Patent Application Serial No. 200810003917.1, Jun. 22, 2011, China.

* cited by examiner

*Primary Examiner* — Keath Chen

(57) ABSTRACT

A film coating system for coating an object includes a working station and an isolating device. The object is disposed on the working station, and the isolating device is utilized to isolate the object. The isolating device includes a body generating a first power, a first working fluid, a second working fluid, a first guiding portion and a second guiding portion. The first guiding portion guides the first working fluid to pass through the body, thereby forming a first working region to coat the object thereon. The second guiding portion guides the second working fluid excited by the first power of the body to pass through the body, thereby forming a second working region to separate the first working region from the object.

16 Claims, 3 Drawing Sheets

FILM COATING SYSTEM AND ISOLATING DEVICE THEREOF

BACKGROUND OF THE INVENTION

1. Field of the Invention

The invention relates to an isolating device, and more particularly to a film coating system and an isolating device thereof provided with a normal-pressure plasma film deposition process and high-quality film.

2. Description of the Related Art

Recently, plasma containing high-energy particles, e.g. electron and ions, and active species, are popular utilized in techniques for performing coating, etching, or surfacing processes on a work piece or products in the fields, such as photoelectronics, semiconductors, computers, communication, consumer electronics, automobile, civilian and biomedical materials.

Due to the high-quality requirement of controlling photoelectronic and semiconductor processes, plasma must be performed in a vacuum environment which requires high cost vacuum equipment. Thus, the high-cost vacuum plasma technique requirement limits the development of conventional industry use.

Some researchers have developed atmospheric plasma (or normal-pressure plasma) which is excited under atmospheric pressure without requiring a vacuum environment and has a much lower cost than the vacuum plasma technique, thus, a linearly atmospheric pressure plasma system can be constructed. In addition, the atmospheric pressure plasma system can provide an effective plasma region for processing a large area of the work piece and performing a series of roll-to-roll processes (which is limited by the chamber in a vacuum plasma system), thus the running cost of products can be reduced.

Additionally, studies and researches related to atmospheric plasma techniques have been rapidly developed. However, process repeatability and quality control of films are difficult to control using the techniques. For example, the film monomers injected into the present atmospheric pressure plasma system, i.e., the film monomers are directly contacted by the electrodes and the plasma, results in the loss of the electrodes and the unwanted films coated on the electrodes. Thus, quality of the generated plasma is unstable (i.e., process repeatability is indirectly influenced thereby) and quality of the coated film on the work piece is lowered because the unfinished unwanted films of the electrodes tend to fall on the work piece during the next film deposition process. Additionally, quality of the coated film is determined by controlling of the environment surrounding the film deposition.

BRIEF SUMMARY OF THE INVENTION

To solve the above problems, the invention provides a film coating system and an isolating device thereof with a normal-pressure plasma film deposition process and high-quality film, thereby performing thin-film deposition under atmospheric environment.

An embodiment of the film coating system utilized for coating an object comprises a working station and an isolating device. The working station is utilized for the placement of the object, and the isolating device is utilized to isolate the object placed at the working station. The isolating device comprises a body generating a first power, a first working fluid, a second working fluid, a first guiding portion and a second guiding portion. The first guiding portion guides the first working fluid to pass through the body to form a first working region for coating the object. The second guiding portion guides the second working fluid to pass through the body. The second working fluid is excited by the first power generated by the body to form a second working region for isolating the first working region and the object.

The body is rotated about an axis. The body can comprise an electrode structure. The body further generates a second power to heat the first working fluid guided by the first guiding portion.

The first guiding portion comprises a hollow pipe. The second guiding portion is rotated about an axis. The second guiding portion penetrates through the body. The second guiding portion comprises a hollow pipe. The second guiding portion is made of dielectric material.

The film coating system can further comprise a head disposed on the first guiding portion, thereby forming the first working region by outputting the first working fluid via the head. The second working region substantially comprises a hollow structure utilized to enclose the first working region. The second working region is formed by plasma. The working station comprises a roll-to-roll stage. The first working region comprises a plurality of film monomers. The second working fluid comprises ionized gas.

The isolating device is situated in a normal pressure environment. The object is made of material capable of being coated.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
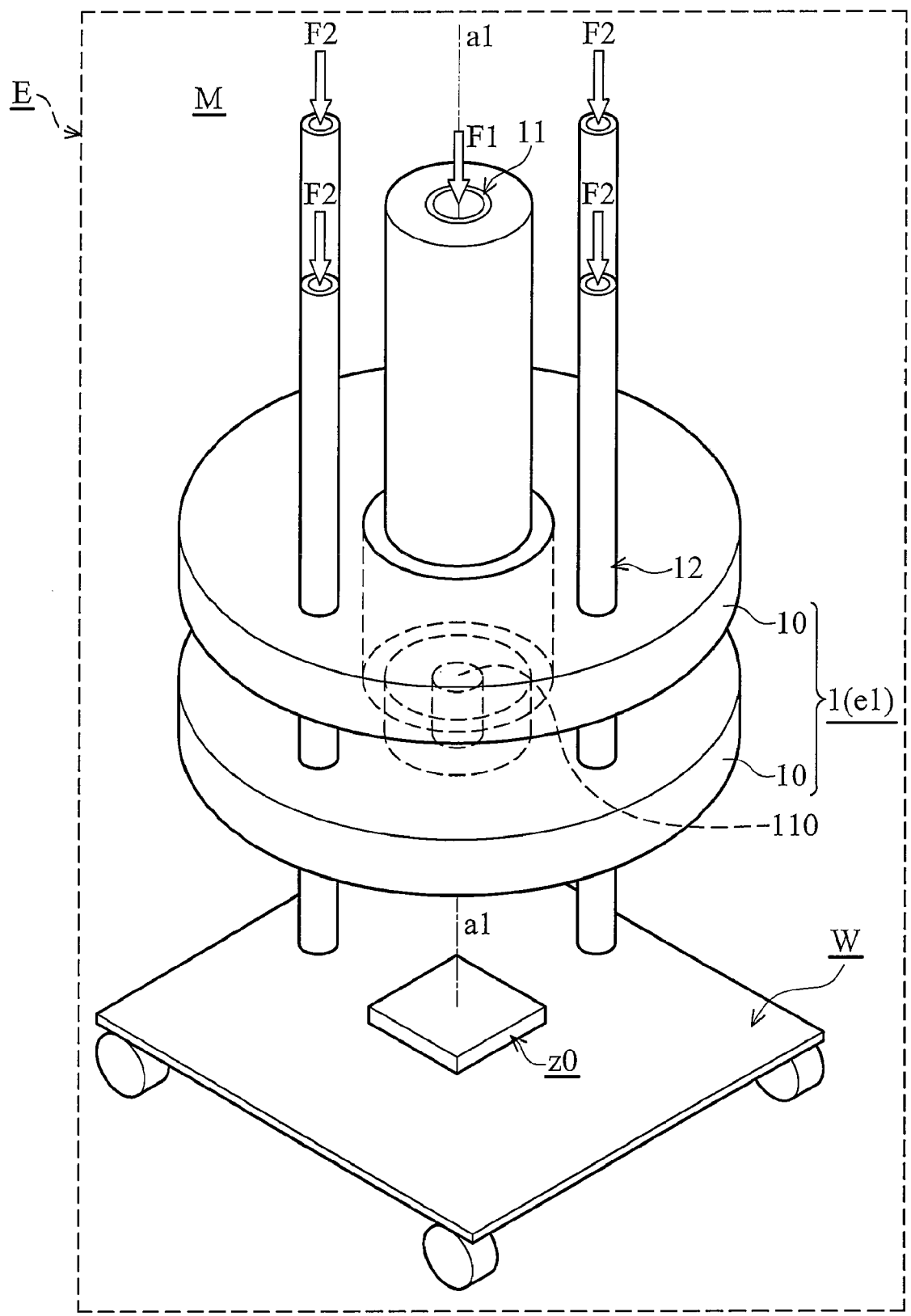
FIG. 1A is a schematic view of a film coating system of the invention.
Figure 1B:
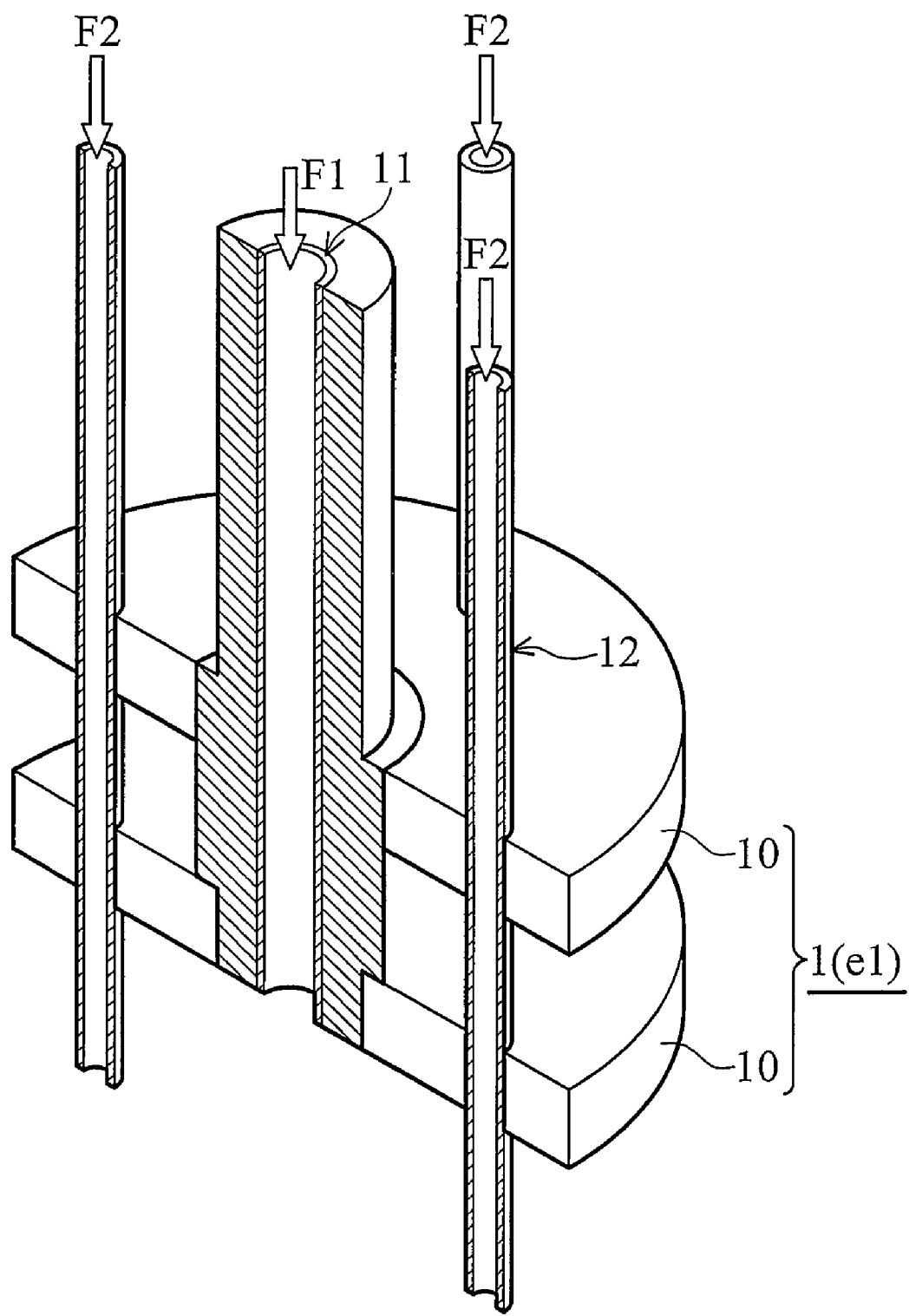
FIG. 1B is a sectional view of the film coating system along an axis (a1-a1) of FIG. 1A.
Figure 2:
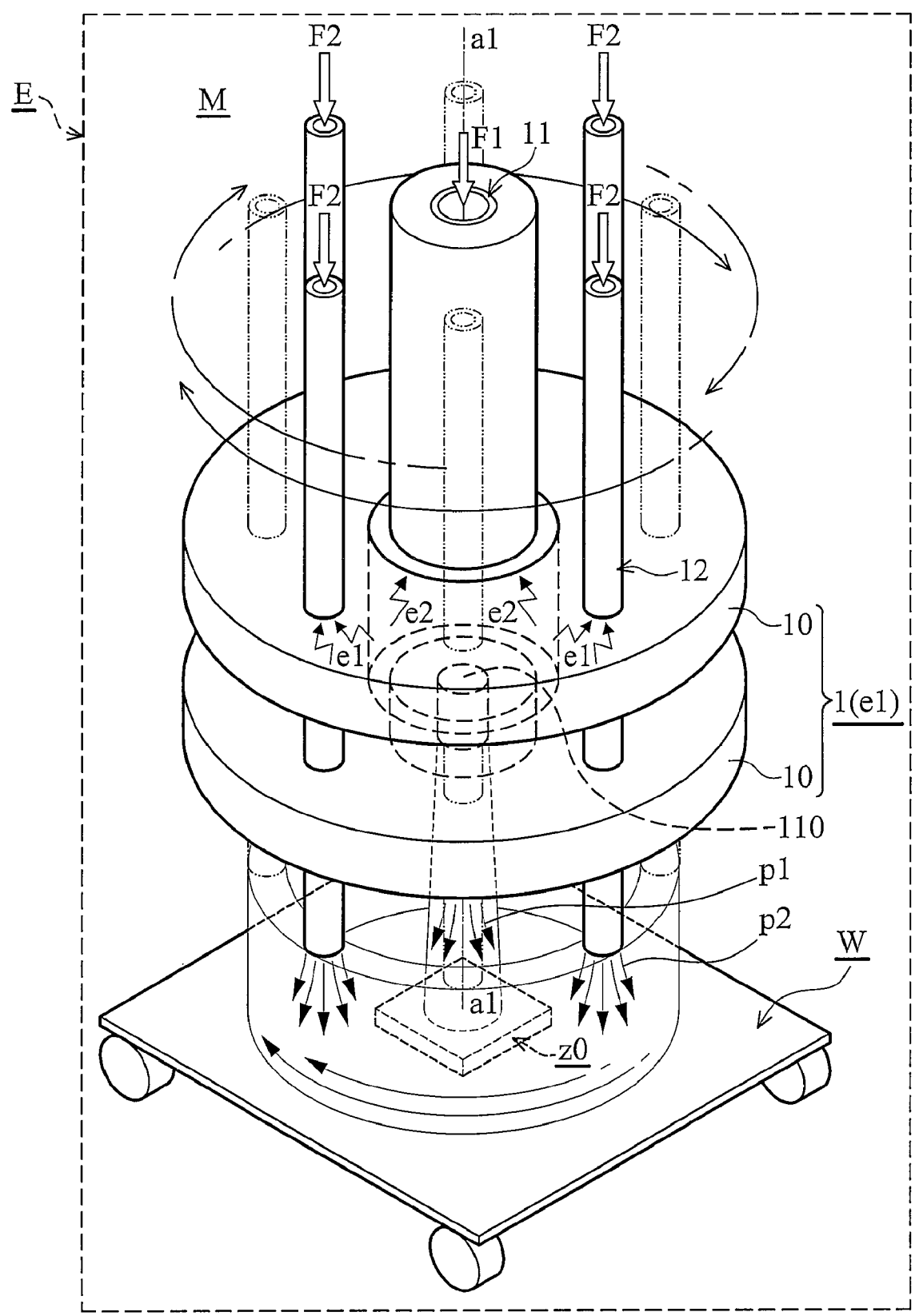
FIG. 2 is a schematic view showing the operation of the film coating system of the invention.

FIG. 1A is a schematic view of a film coating system E of the embodiment, and FIG. 1B is a sectional view of the film coating system E along an axis a1-a1 of FIG. 1A. FIG. 2 is a schematic view showing the operation of the film coating system E. In the embodiment, the thin-film deposition process of the film coating system E is performed in a normal pressure environment.

In FIG. 2, the film coating system E is utilized to perform film-coating process or film-depositing process on an object z0, thereby forming a film on the object z0. The material of the object z0 can be hard one, e.g., wafer, metal, etc., or soft one, e.g., plastic, polymer, etc. which are capable of being coated. The film coating system E comprises a working station W utilized for the placement of the object z0 and an isolating device M utilized to isolate the object z0 placed at the working station W. In the embodiment, the working station W is a roll-to-roll stage. The isolating device M comprises a body 1 rotated about the axis a1-a1, a head 110, a first working fluid F1, a second working fluid F2, a first guiding portion 11, and a second guiding portion 12 rotated about the axis a1-a1. In the embodiment, the first working region p1 is formed by a plurality of film monomers, and the second working fluid F2 is ionized gas.

The body 1 comprises a plurality of spaced bases 10 generating a first power e1 and a second power e2. The second power e2 is utilized to preheat the first working fluid F1 guided by the first guiding portion 11. In the embodiment, the base 10 of the body 1 is an electrode structure.

The head 110 is disposed at the first guiding portion 11. The first working fluid F1 guided by the first guiding portion 11 to pass through the bases 10 of the body 1 is output by the head 110, thereby forming a first working region p1 to coat the object z0. In the embodiment, the first guiding portion 11 is a hollow pipe.

The second guiding portion 12 penetrating through the body 1 guides the second working fluid F2 to pass through the bases 10 of the body 1. The second working fluid F2 is excited by the first power e1 generated by the body 1 to form a second working region p2 for isolating the first working region p1 and the object z0. In the embodiment, the second guiding portion 12 is a hollow pipe made of dielectric material. In the embodiment, the second working region p2 is formed by plasma, and the second working region p2 substantially is a hollow structure or plasma curtain utilized to enclose the first working region p1.

It is understood that the first working fluid F1 (film monomers) is preheated by the bases 10 (electrode structure) of the body 1, and the flows of the second working fluid F2 (ionized gas) and the first working fluid F1 (film monomers) are split. That is, the second working region p2 (plasma) is not directly contacted with the first working fluid F1 (film monomers), and the deposition environment for the object z0 is separated from the exterior environment by the second working region p2 (plasma), thereby increasing the quality of the film coated on the object z0.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An isolating device, comprising:
    a body rotating about an axis and generating a first power, wherein the body comprises a plurality of plate-shaped electrode structures to generate the first power, and each of the plate-shaped electrode structures forms a planar main surface;
    a first working fluid;
    a second working fluid;
    a first guiding portion penetrating through the plate-shaped electrode structures along a direction substantially perpendicular to the planar main surfaces of the plate-shaped electrode structures and guiding the first working fluid to pass through the body to form a first working region, wherein the first working fluid is isolated from the plate-shaped electrode structures by the first guiding portion; and
    at least two discrete second guiding portions spaced apart in a circumferential direction and penetrating through the plate-shaped electrode structures along the direction substantially perpendicular to the planar main surfaces of the plate-shaped electrode structures, rotating about the axis and guiding the second working fluid to pass through the body, wherein the second working fluid is isolated from the plate-shaped electrode structures by the second guiding portions, and the plate-shaped electrode structures generate an electrical field substantially parallel to the first and second guiding portions;
    wherein the second working fluid is excited by the first power entirely generated by the plate-shaped electrode structures of the body to form a second working region which rotates about the axis and forms a plasma curtain for isolating the first working region.

2. The isolating device as claimed in claim 1, wherein the body further generates a second power to heat the first working fluid guided by the first guiding portion.

3. The isolating device as claimed in claim 1, wherein the second guiding portions are made of dielectric material.

4. The isolating device as claimed in claim 1 further comprising a head disposed on the first guiding portion, thereby forming the first working region by outputting the first working fluid via the head.

5. The isolating device as claimed in claim 1, wherein the first working region comprises a plurality of monomers.

6. The isolating device as claimed in claim 1, wherein the second working fluid comprises ionized gas.

7. The isolating device as claimed in claim 1, wherein the isolating device is situated in a normal pressure environment.

8. A film coating system for coating an object, comprising:
    a working station utilized for the placement of the object; and
    an isolating device utilized to isolate the object placed at the working station, comprising:
        a body rotating about an axis and generating a first power, wherein the body comprises a plurality of plate-shaped electrode structures to generate the first power, and each of the plate-shaped electrode structures forms a planar main surface;
        a first working fluid;
        a second working fluid;
        a first guiding portion penetrating through the plate-shaped electrode structures along a direction substantially perpendicular to the planar main surfaces of the plate-shaped electrode structures and guiding the first working fluid to pass through the body to form a first working region for coating the object, wherein the first working fluid is isolated from the plate-shaped electrode structures by the first guiding portion; and
        at least two discrete second guiding portions spaced apart in a circumferential direction and penetrating through the plate-shaped electrode structures along the direction substantially perpendicular to the planar main surfaces of the plate-shaped electrode structures, rotating about the axis and guiding the second working fluid to pass through the body, wherein the second working fluid is isolated from the plate-shaped electrode structures by the second guiding portions, and the plate-shaped electrode structures generate an electrical field substantially parallel to the first and second guiding portions;
        wherein the second working fluid is excited by the first power entirely generated by the plate-shaped electrode structures of the body to form a second working region which rotates about the axis and forms a plasma curtain for isolating the first working region and the object.

9. The film coating system as claimed in claim 8, wherein the body further generates a second power to heat the first working fluid guided by the first guiding portion.

10. The film coating system as claimed in claim 8, wherein the second guiding portions are made of dielectric material.

11. The film coating system as claimed in claim 8 further comprising a head disposed on the first guiding portion, thereby forming the first working region by outputting the first working fluid via the head.

12. The film coating system as claimed in claim 8, wherein the working station comprises a roll-to-roll stage.

13. The film coating system as claimed in claim 8, wherein the first working region comprises a plurality of film monomers.

14. The film coating system as claimed in claim 8, wherein the second working fluid comprises ionized gas.

15. The film coating system as claimed in claim 8, wherein the isolating device is situated in a normal pressure environment.

16. The film coating system as claimed in claim 8, wherein the object is made of material capable of being coated.

* * * * *